US010410955B2

(12) United States Patent
Tsai et al.

(10) Patent No.: US 10,410,955 B2
(45) Date of Patent: Sep. 10, 2019

(54) LIQUID COOLING HEAT SINK STRUCTURE AND COOLING CIRCULATION SYSTEM THEREOF

(71) Applicant: COOLER MASTER CO., LTD., New Taipei (TW)

(72) Inventors: Shui-Fa Tsai, New Taipei (TW); Chang-Han Tsai, New Taipei (TW)

(73) Assignee: Cooler Master Co., Ltd., New Taipei (TW)

( * ) Notice: Subject to any disclaimer, the term of this patent is extended or adjusted under 35 U.S.C. 154(b) by 0 days.

(21) Appl. No.: 14/988,753

(22) Filed: Jan. 6, 2016

(65) Prior Publication Data

US 2016/0216048 A1 Jul. 28, 2016

(30) Foreign Application Priority Data

Jan. 28, 2015 (CN) .................... 2015 2 0060654 U
Oct. 28, 2015 (CN) .................... 2015 2 0843219 U

(51) Int. Cl.
*H01L 23/473* (2006.01)
*F28F 3/02* (2006.01)
(Continued)

(52) U.S. Cl.
CPC ............ *H01L 23/473* (2013.01); *F28D 15/00* (2013.01); *F28F 3/02* (2013.01); *F28F 3/12* (2013.01);
(Continued)

(58) Field of Classification Search
CPC ........ F28D 2021/0028; H05K 7/20509; H01L 23/473
See application file for complete search history.

(56) References Cited

U.S. PATENT DOCUMENTS 5,052,472 A * 10/1991 Takahashi ............... F25B 13/00
                                                                            165/101
6,054,676 A    4/2000 Wall et al.
(Continued)

FOREIGN PATENT DOCUMENTS

DE   102011121064 A1 *  6/2013  ........... H01L 23/473
JP       61018159 A  *  1/1986  ........... H01L 23/433
(Continued)

OTHER PUBLICATIONS

Schreck, DE 102011121064, Jun. 20, 2013, machine translation.*
(Continued)

*Primary Examiner* — Hung Q Nguyen
*Assistant Examiner* — Mark L. Greene
(74) *Attorney, Agent, or Firm* — McDermott Will & Emery LLP

(57) ABSTRACT

A liquid cooling heat sink structure and its cooling circulation system include a thermal conduction module, and a liquid supply module, and the liquid supply module is installed on the thermal conduction module and has a containing space for receiving plural fins of the thermal conduction module, and the liquid supply module has a continuous surrounding peripheral wall oriented in a plurality of directions facing towards the outside of the liquid supply module, and the peripheral wall has two first liquid opening and a second liquid opening, and the two first liquid opening are disposed at positions of the peripheral wall in any two facing directions respectively.

5 Claims, 5 Drawing Sheets

(51) Int. Cl.
  *H05K 7/20* (2006.01)
  *F28F 3/12* (2006.01)
  *F28D 15/00* (2006.01)
  *F28D 21/00* (2006.01)

(52) U.S. Cl.
  CPC .. *H05K 7/20509* (2013.01); *F28D 2021/0028* (2013.01)

(56) References Cited

U.S. PATENT DOCUMENTS

| | | | |
|---|---|---|---|
| 6,167,952 B1* | 1/2001 | Downing | F28F 3/086 165/167 |
| 6,966,359 B1* | 11/2005 | Liu | F28D 15/0266 165/104.21 |
| 7,007,506 B2 | 3/2006 | Kubo et al. | |
| 7,055,581 B1 | 6/2006 | Roy | |
| 7,240,722 B2 | 7/2007 | Lai et al. | |
| 7,249,625 B2 | 7/2007 | Duan | |
| 7,325,591 B2 | 2/2008 | Duan et al. | |
| 8,051,898 B2 | 11/2011 | Chiang | |
| 8,240,362 B2 | 8/2012 | Eriksen | |
| 8,245,764 B2 | 8/2012 | Eriksen | |
| 8,261,813 B2 | 9/2012 | Oikawa | |
| 8,746,330 B2 | 6/2014 | Lyon | |
| 9,345,169 B1 | 5/2016 | Campbell et al. | |
| 9,441,640 B2 | 9/2016 | Park et al. | |
| 9,795,058 B2 | 10/2017 | Tsai | |
| 2004/0130874 A1 | 7/2004 | Maveety et al. | |
| 2005/0241806 A1* | 11/2005 | Liu | F28D 15/0266 165/104.21 |
| 2006/0185378 A1 | 8/2006 | Duan et al. | |
| 2006/0225867 A1 | 10/2006 | Park et al. | |
| 2008/0029260 A1* | 2/2008 | Hu | F28F 3/027 165/182 |
| 2009/0101316 A1 | 4/2009 | Han et al. | |
| 2009/0159244 A1 | 6/2009 | Mounioloux | |
| 2009/0284921 A1 | 11/2009 | Colgan et al. | |
| 2012/0152498 A1 | 6/2012 | Lyon | |
| 2012/0175094 A1 | 7/2012 | Rice | |
| 2013/0008628 A1* | 1/2013 | Tiengtum | G01R 31/2874 165/100 |
| 2013/0051108 A1* | 2/2013 | Nagao | H05K 7/20927 363/141 |
| 2015/0021756 A1* | 1/2015 | Adachi | H01L 23/473 257/714 |
| 2016/0309618 A1 | 10/2016 | Tsai et al. | |
| 2016/0338223 A1 | 11/2016 | Tsai et al. | |
| 2016/0363967 A1 | 12/2016 | Tsai | |
| 2017/0045300 A1 | 2/2017 | Boday et al. | |
| 2017/0045306 A1 | 2/2017 | Tsai | |
| 2017/0045307 A1 | 2/2017 | Tsai | |
| 2017/0118870 A1 | 4/2017 | Yin et al. | |
| 2017/0192471 A1 | 7/2017 | Tsai et al. | |
| 2017/0235350 A1 | 8/2017 | Tsai | |
| 2018/0139865 A1 | 5/2018 | Draht et al. | |
| 2018/0213677 A1 | 7/2018 | Wu et al. | |
| 2018/0259267 A1 | 9/2018 | Tsai et al. | |
| 2018/0332734 A1 | 11/2018 | Bandorawalla et al. | |
| 2018/0340744 A1 | 11/2018 | Tsai et al. | |

FOREIGN PATENT DOCUMENTS

| | | |
|---|---|---|
| KR | 10-0529825 B1 | 11/2005 |
| TW | M278938 U | 10/2005 |
| TW | M311234 U | 5/2007 |

OTHER PUBLICATIONS

Keikoin, JP 61-18159, Jan. 27, 1986, machine translation.*
Non-Final Office Action issued in U.S. Appl. No. 15/433,073, dated Jun. 22, 2018.
Chinese Patent Application No. 201611132425.3 filed Dec. 9, 2016 with English translation.
Chinese Patent Application CN 201511023351.5 filed Dec. 30, 2015 with English translation.
Non-Final Office Action issued in U.S. Appl. No. 15/395,954, dated Feb. 15, 2019.
Final Office Action issued in U.S. Appl. No. 15/433,073, dated Nov. 13, 2018.

* cited by examiner

LIQUID COOLING HEAT SINK STRUCTURE AND COOLING CIRCULATION SYSTEM THEREOF

FIELD OF THE INVENTION

The technical field relates to heat dissipating systems, more particularly to a liquid cooling heat sink structure and its cooling circulation system.

BACKGROUND OF THE INVENTION

As the processing speed and performance of a central processing unit (CPU) of a computer are enhanced, the heat dissipation problem becomes increasingly more serious, and thus a liquid cooling heat sink structure and its cooling circulation system are introduced.

In general, a conventional cooling circulation system comprises a heat sink structure attached onto a surface of a heat source, a water-cooled exhaust for supplying a cooling liquid to dissipate heat, and a connecting pipeline for connecting the aforementioned components and circulating the cooling liquid in the connecting pipeline. When the cooling liquid passes through the interior of the heat sink structure, the heat absorbed by the heat sink structure is carried away quickly to achieve the cooling and heat dissipating effects, so as to overcome the current problem of having high heat generated by the heat source.

However, the configuration of the aforementioned components is limited by the preset pipeline port positions, so that the installation position of each component is also limited and cannot be adjusted flexibly.

In view of the aforementioned drawbacks of the prior art, the disclosure of this disclosure conducted extensive researches and experiments, and finally provided a feasible and effective solution to overcome the drawbacks of the prior art.

SUMMARY OF THE INVENTION

It is a primary objective of this disclosure to provide a liquid cooling heat sink structure and its cooling circulation system, wherein a preset connecting port is provided for different configuration requirements and flexible applications, and any port not in use is sealed by a plug member.

To achieve the aforementioned and other objectives, this disclosure provides a liquid cooling heat sink structure comprising a thermal conduction module, and a liquid supply module; and the thermal conduction module comprises a thermal conductive substrate, and a plurality of fins installed on the thermal conductive substrate; and the liquid supply module is installed on the thermal conductive substrate, and the liquid supply module has a containing space formed therein, and the fins are disposed in the containing space, and the liquid supply module has a continuous surrounding peripheral wall facing oriented in a plurality of directions facing towards the outside of the liquid supply module, and the peripheral wall has at least two first liquid opening and a second liquid opening which are communicated with the containing space, and the two first liquid opening are disposed at positions of the peripheral wall in any two facing directions respectively.

To achieve the aforementioned and other objectives, this disclosure provides a cooling circulation system comprising a water-cooled exhaust and at least two of the aforementioned liquid cooling heat sink structures; wherein a first liquid opening and a second liquid opening of the two liquid cooling heat sink structures are coupled by a pipe connector and connected in series with the water-cooled exhaust by the connecting pipeline.

To achieve the aforementioned and other objectives, this disclosure provides a cooling circulation system comprising a water-cooled exhaust, and at least two of the aforementioned liquid cooling heat sink structures; wherein a first liquid opening and a second liquid opening of the two liquid cooling heat sink structures are coupled by a pipe connector and connected in parallel with the water-cooled exhaust by the connecting pipeline.

DESCRIPTION OF THE PREFERRED EMBODIMENTS

The technical contents of this disclosure will become apparent with the detailed description of preferred embodiments accompanied with the illustration of related drawings as follows. It is intended that the embodiments and figures disclosed herein are to be considered illustrative rather than restrictive.

Figure 1:
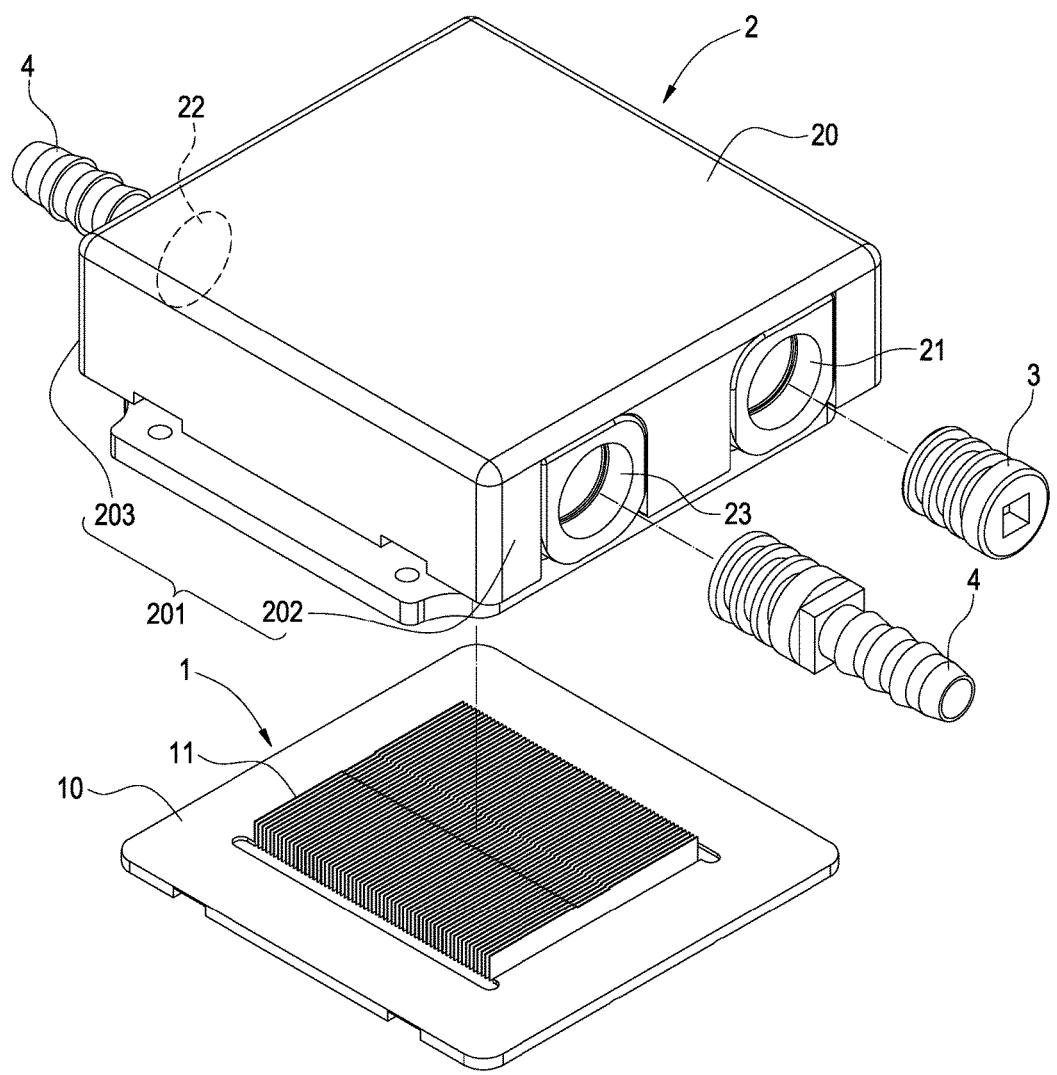
FIG. 1 is an exploded view of a liquid cooling heat sink structure of this disclosure.
Figure 2:
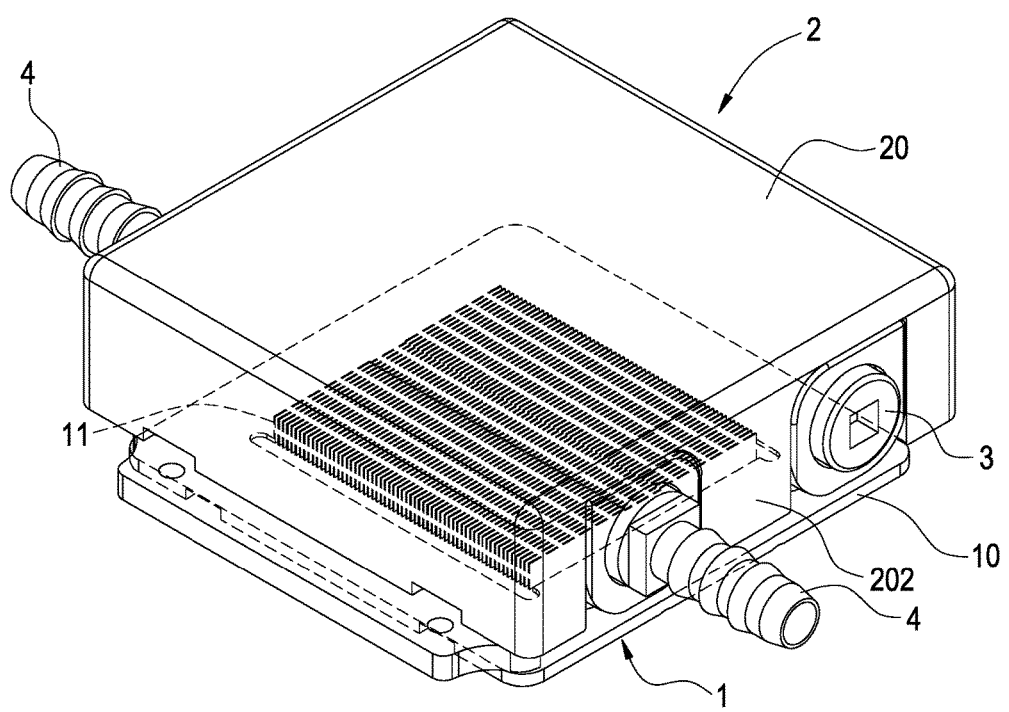
FIG. 2 is a perspective view of a liquid cooling heat sink structure of this disclosure.

With reference to FIGS. 1 and 2 for an exploded view and a perspective view of a liquid cooling heat sink structure and its cooling circulation system of this disclosure respectively, the cooling circulation system comprises one or more liquid cooling heat sink structures, and the heat sink structure provided for passing through a cooling liquid (not shown in the figure) comprises a thermal conduction module 1, and a liquid supply module 2.

Figure 4:
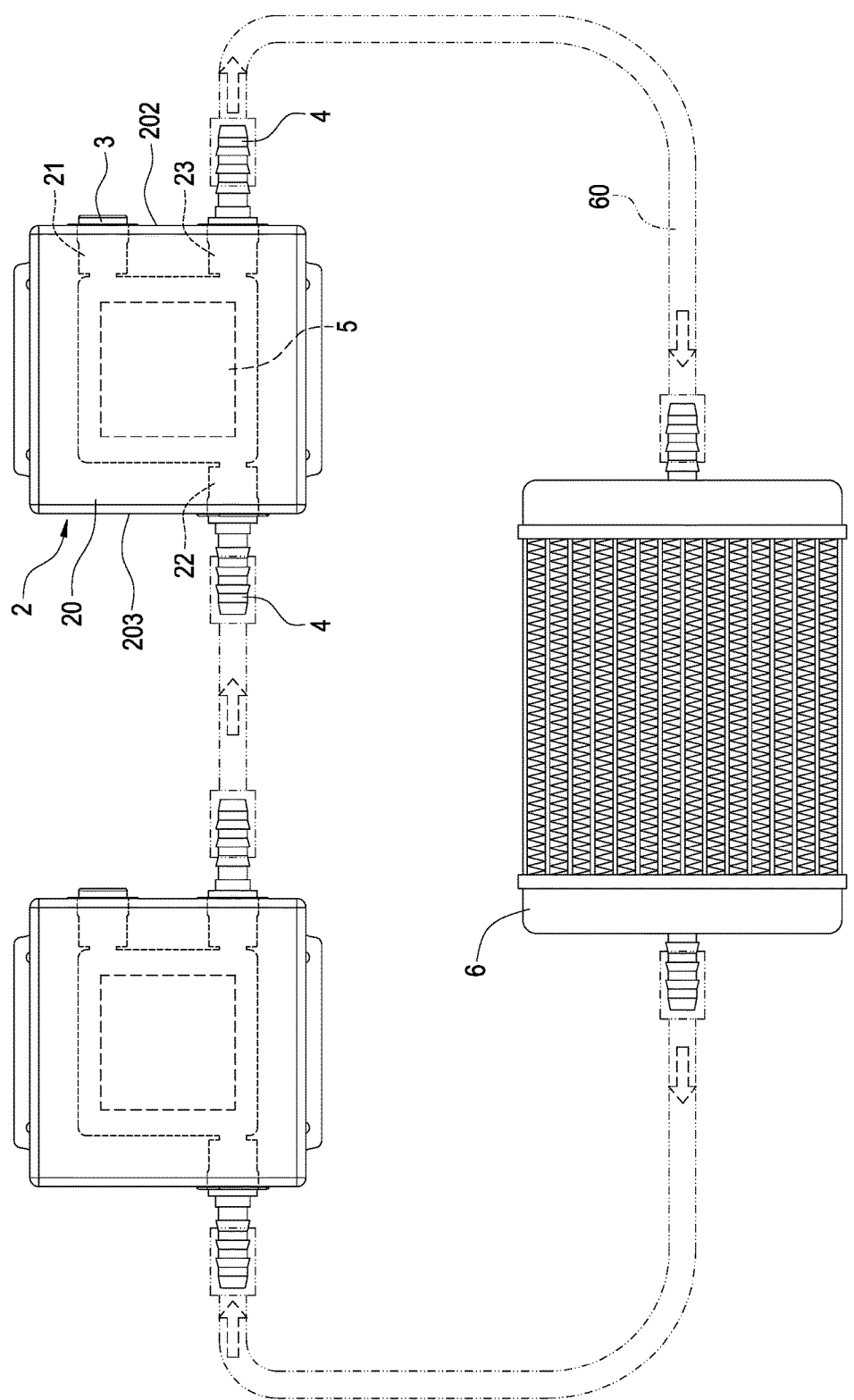
FIG. 4 is a schematic view of a cooling circulation system in accordance with a first preferred embodiment of this disclosure.
Figure 5:
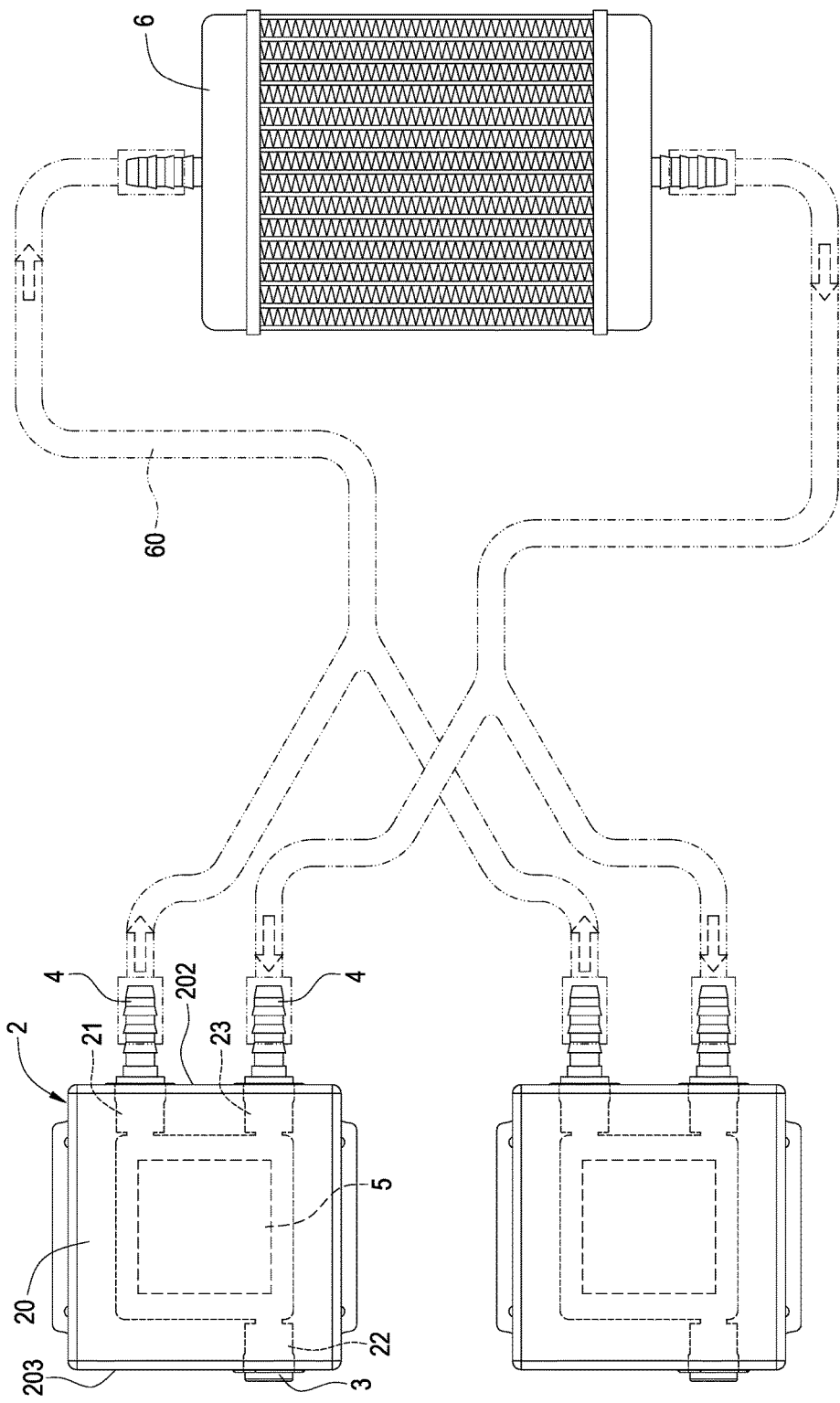
FIG. 5 is a schematic view of a cooling circulation system in accordance with a second preferred embodiment of this disclosure.

The thermal conduction module 1 comprises a thermal conductive substrate 10, and a plurality of fins 11 installed on the thermal conductive substrate 10. The bottom of the thermal conductive substrate 10 is provided for contacting a heat source 5 (as shown in FIG. 4 or 5), and the heat source 5 may be a central processing unit (CPU), a graphic processing unit (GPU), or any other heat generating electronic component or chip, and the thermal conductive substrate 10 conducts the heat to the fins 11 for heat dissipation or cooling.

Figure 3:
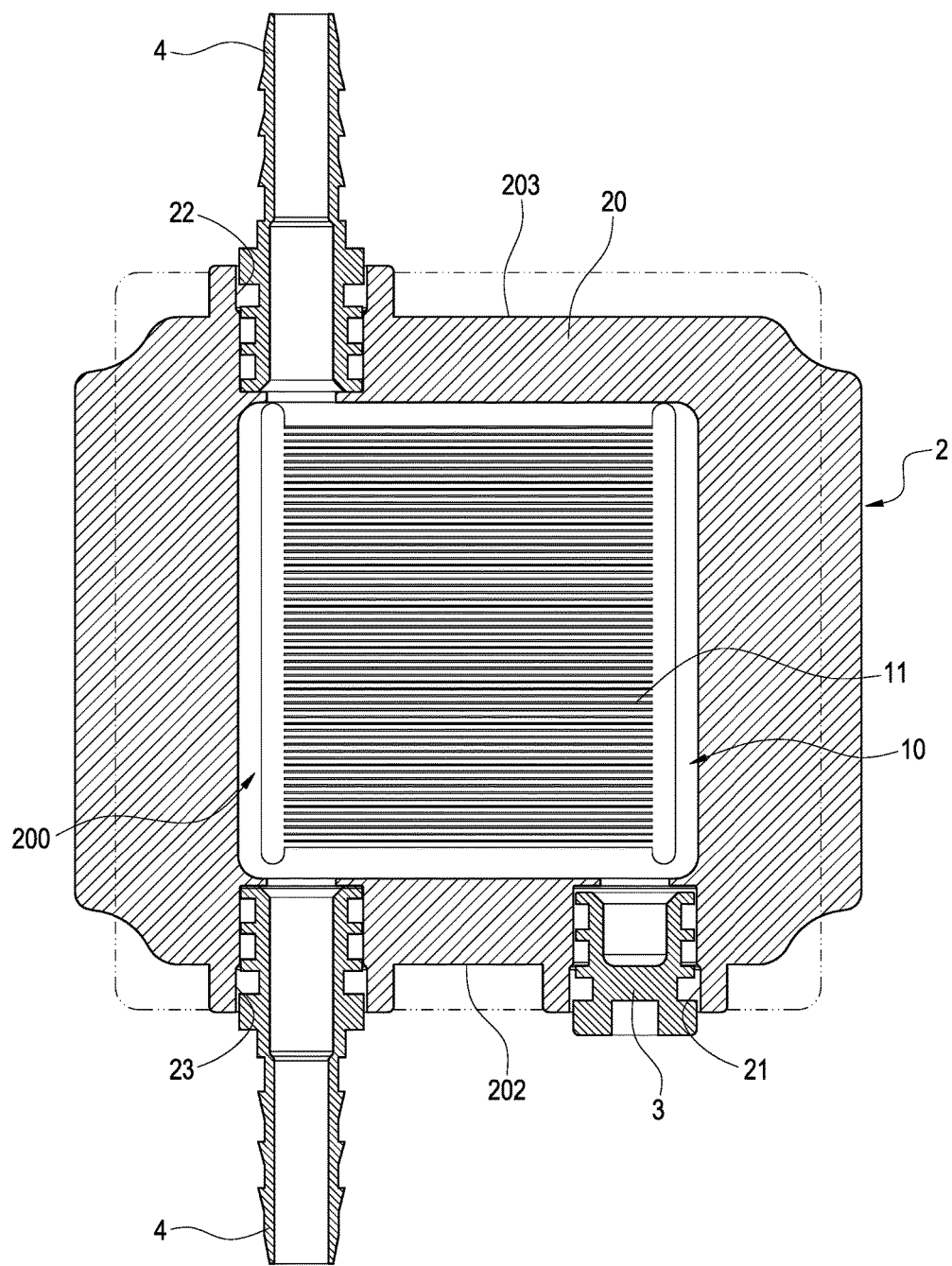
FIG. 3 is a cross-sectional view of a liquid cooling heat sink structure of this disclosure.

The liquid supply module 2 is installed on the thermal conductive substrate 10. With reference to FIG. 3 for a preferred embodiment of this disclosure, the liquid supply module 2 includes a casing 20 having a containing space 200 formed therein. When the casing 20 is installed on the thermal conductive substrate 10, the fins 11 of the thermal conduction module 1 are situated in the containing space 200 and provided for entering the cooling liquid into the containing space 200, and the fins 11 are provided for carrying the heat absorbed by the cooling liquid, so as to achieve a good cooling effect by using the cooling liquid.

With reference to FIGS. 1, 2 and 3 for a liquid cooling heat sink structure of this disclosure, the liquid cooling heat sink structure has a continuous surrounding peripheral wall 201 formed on the liquid supply module 2 and continuously surrounding a surrounding surface of the casing 20 and oriented in a plurality of directions facing towards the outside of liquid supply module 2. More specifically, in a preferred embodiment of this disclosure, the peripheral wall 201 is in a rectangular shape which is corresponsive to the shape of the casing 20 and at least has a first wall 202 and a second wall 203, and the first and second walls 202 are opposite to each other and oriented in different directions facing the outside of the liquid supply module 2. In the meantime, the peripheral wall 201 has at least two first liquid opening 21, 22, and a second liquid opening 23, and the first liquid opening 21, 22 and the second liquid opening 23 are communicated with the containing space 200 of the casing 20, and the first liquid opening 21, 22 are disposed at positions on any two different facing surfaces of the peripheral wall 201. In a preferred embodiment of this disclosure, the two first liquid opening 21, 22 are disposed on the first wall 202 and the second wall 203 respectively. Since the first and second walls 202, 203 are opposite to each other, therefore they are configured in different directions facing the liquid supply module 2. In other words, the two first liquid opening 21, 22 formed on the first and second walls 202, 203 respectively are naturally disposed at positions of different facing surfaces.

This disclosure further comprises a plug member 3 selectively installed on any first liquid opening 21, 22 to seal the first liquid opening 21 or 22. Therefore, the heat sink structure may be used according to the connecting position of the pipeline, and the liquid opening 21, 22 or 23 may be used as liquid inlets or outlets (such as the two first liquid opening 21, 22 being liquid inlets, and the second liquid opening 23 being a liquid outlet; or the two first liquid opening 21, 22 being liquid outlets, and the second liquid opening 23 being a liquid inlet), and one of the two first liquid opening 21, 22 is selected for use, and the other first liquid opening 22, 21 is sealed by the plug member 3, so as to provide the effect of configuring the heat sink structure more flexibly.

By the aforementioned components, the liquid cooling heat sink structure of this disclosure is formed.

In addition, this disclosure further provides a cooling circulation system. With reference to FIG. 4 for a cooling circulation system in accordance with the first preferred embodiment of this disclosure, the cooling circulation system comprises at least two heat sink structures, and a water-cooled exhaust 6, and the two heat sink structures and the water-cooled exhaust 6 are connected in series. Wherein, any one of the first liquid opening 21 of the two heat sink structures is sealed by the plug member 3, and the other first liquid opening 22 and the second liquid opening 23 are connected by a pipe connector 4, so that the connecting pipeline 60 connects the two heat sink structures and the water-cooled exhaust 6 in series. Now, the second liquid opening 23 and the other a first liquid opening 22 connected to the pipe connector 4 are disposed on different facing surfaces (or situated on the first wall 202 and the second wall 203 of the peripheral wall 201 respectively; in other words, the first liquid opening 21 connected to the plug member 3 and the second liquid opening 23 are disposed at positions of different facing surfaces respectively).

With reference to FIG. 5 for a cooling circulation system in accordance with the second preferred embodiment of this disclosure, the cooling circulation system is connected to the two heat sink structures and the water-cooled exhaust 6 in parallel. Wherein, any one of the first liquid opening 22 of the two heat sink structures is sealed by the plug member 3 and the other first liquid opening 21 and the second liquid opening 23 are connected by a pipe connector 4, so that the connecting pipeline 60 connects the two heat sink structures and the water-cooled exhaust 6 in parallel. Now, the second liquid opening 23 and the first liquid opening 21 connected with the pipe connector 4 are disposed on the same surface (or the first wall 202 of the peripheral wall 201).

By the aforementioned components, the cooling circulation system of this disclosure is formed.

In summation of the description above, the liquid cooling heat sink structure and its cooling circulation system in accordance with this disclosure are novel and inventive and comply with patent application requirements, and thus this disclosure is filed for patent application.

While this disclosure has been described by means of specific embodiments, numerous modifications and variations could be made thereto by those skilled in the art without departing from the scope and spirit of this disclosure set forth in the claims.

What is claimed is:

1. A cooling circulation system, comprising:
an exhaust; and
at least two liquid cooling heat sink structures;
wherein each of the at least two liquid cooling heat sink structures comprises:
a thermal conduction module including a thermal conductive substrate having a first surface and a second surface opposite the first surface, the first surface including a plurality of fins and the second surface configured to receive an electronic component that generates heat that is dissipated at least in part by the plurality of fins; and
a liquid supply module, installed on the thermal conductive substrate, and
including a containing space for receiving the plurality of fins, and a continuous surrounding peripheral wall oriented in a plurality of directions facing towards the outside of the liquid supply module, and two inlets and an outlet formed on the continuous surrounding peripheral wall and communicated to the containing space,
wherein the continuous surrounding peripheral wall comprises a first wall and a second wall, and the first wall and the second wall are opposite to each other,
wherein a first inlet of the two inlets is in the first wall and a second inlet of the two inlets is in the second wall of the continuous surrounding peripheral wall,
wherein the outlet is in the first wall of the continuous surrounding periphery wall, and
wherein the second inlet is opposite the outlet, and the first inlet and the second inlet are laterally offset from each other; and
wherein, the second inlet of a first liquid cooling heat sink structure of the at least two liquid cooling heat sink structures and the outlet of a second liquid cooling heat sink structure of the at least two liquid cooling heat sink structures are coupled by a pipe connector and connected in series with the exhaust by a connecting pipeline.

2. The cooling circulation system according to claim 1, wherein the liquid supply module has a casing, and the containing space is formed in the casing.

3. The cooling circulation system according to claim 2, wherein the continuous surrounding peripheral wall continuously surrounds a surrounding surface of the casing.

4. The cooling circulation system according to claim 1, further comprising a plug member installed in at least one of the first inlets of the at least two liquid cooling heat sink structures.

5. The cooling circulation system according to claim 1, wherein the first inlet and the outlet of each of the at least two liquid cooling heat sink structures are disposed at positions of the same facing direction.

* * * * *